United States Patent [19]

MacNaughton et al.

[11] Patent Number: 5,374,592
[45] Date of Patent: Dec. 20, 1994

[54] METHOD FOR FORMING AN ALUMINUM METAL CONTACT

[75] Inventors: Robert B. MacNaughton, Plano; De-Dui Liao, Richardson, both of Tex.

[73] Assignee: SGS-Thomson Microelectronics, Inc., Carrollton, Tex.

[21] Appl. No.: 192,786

[22] Filed: Feb. 7, 1994

Related U.S. Application Data

[63] Continuation of Ser. No. 948,690, Sep. 22, 1992, abandoned.

[51] Int. Cl.⁵ .............................. H01L 21/44
[52] U.S. Cl. ........................ 437/194; 437/197; 437/245
[58] Field of Search ...................... 437/194, 197

[56] References Cited

U.S. PATENT DOCUMENTS

| | | |
|---|---|---|
| 3,158,504 | 11/1964 | Anderson . |
| 3,900,598 | 8/1975 | Hall et al. . |
| 4,107,726 | 8/1978 | Schilling . |
| 4,436,582 | 3/1984 | Saxena . |
| 4,502,209 | 3/1985 | Eizenberg et al. . |
| 4,566,177 | 1/1986 | van de Ven . |
| 4,592,802 | 6/1986 | Deleonibus et al. . |
| 4,661,228 | 4/1987 | Mintz . |
| 4,756,810 | 7/1988 | Lamont et al. . |
| 4,759,533 | 7/1988 | Magee et al. . |
| 4,772,571 | 9/1988 | Scovell et al. . |
| 4,837,183 | 6/1989 | Polito et al. . |
| 4,892,844 | 1/1990 | Cheung . |
| 4,944,961 | 7/1990 | Lu . |
| 4,970,176 | 11/1990 | Tracy et al. ............ 437/197 |
| 4,975,389 | 12/1990 | Ryan et al. . |
| 4,976,839 | 12/1990 | Inoue . |
| 4,988,423 | 1/1991 | Yamamoto . |
| 4,994,162 | 2/1991 | Armstrong . |
| 5,106,781 | 4/1992 | Penning ............... 437/194 |
| 5,108,570 | 4/1992 | Wang . |
| 5,108,951 | 4/1992 | Chen et al. ............ 437/187 |

FOREIGN PATENT DOCUMENTS

| | | |
|---|---|---|
| 0107259A3 | 5/1984 | European Pat. Off. . |
| 0132720A1 | 2/1985 | European Pat. Off. . |
| 0137701A1 | 4/1985 | European Pat. Off. . |
| 0168828A2 | 1/1986 | European Pat. Off. . |
| 0257277A2 | 3/1988 | European Pat. Off. . |
| 0269019A3 | 6/1988 | European Pat. Off. . |
| 0273715A2 | 7/1988 | European Pat. Off. . |
| 0276087AA2 | 7/1988 | European Pat. Off. . |
| 0310108A2 | 4/1989 | European Pat. Off. . |
| 0329227A1 | 8/1989 | European Pat. Off. . |
| 0351001A1 | 1/1990 | European Pat. Off. . |
| 0430403A2 | 6/1991 | European Pat. Off. . |
| 0451571A2 | 10/1991 | European Pat. Off. . |
| 54-71564 | 8/1979 | Japan . |

(List continued on next page.)

OTHER PUBLICATIONS

TiN Metallization Barriers: From 1.2μ to 0.35μ Technology Fabio Pintchovski and Ed Travis, Motorola, Inc., Austin, Texas pp. 777-786, 1992 Materials Research Society.

Development of a Planarized Al-Sl Contact Filling Technology Hisako Ono, et al., VMIC Conference, Jun. 1990, pp. 76-82.

(List continued on next page.)

*Primary Examiner*—Brian E. Hearn
*Assistant Examiner*—Michael Trinh
*Attorney, Agent, or Firm*—Kenneth C. Hill; Lisa K. Jorgenson; Richard K. Robinson

[57] ABSTRACT

A method is provided for depositing aluminum thin film layers so as to form an improved metal contact in a semiconductor integrated circuit device. An initial layer of aluminum is deposited at a very low temperature, such as room temperature, to a depth sufficient to form a continuous layer. A second aluminum layer is then deposited at increasing temperatures and lower deposition rates in order to complete the deposition of the layer.

9 Claims, 1 Drawing Sheet

FOREIGN PATENT DOCUMENTS

| | | | |
|---|---|---|---|
| 57-139939 | 8/1982 | Japan | 437/194 |
| 58-46641A | 1/1983 | Japan . | |
| 60-227446 | 11/1985 | Japan . | |
| 61-142739A | 6/1986 | Japan . | |
| 63-124447A | 5/1988 | Japan . | |
| 63-136547 | 6/1988 | Japan | 437/194 |
| 1-160036 | 6/1989 | Japan | 437/194 |
| 01-077122 | 9/1989 | Japan . | |
| 2-137230 | 5/1990 | Japan | 437/194 |
| 2112566A | 7/1983 | United Kingdom . | |
| 22128636A | 5/1984 | United Kingdom . | |

OTHER PUBLICATIONS

Aluminum Metallization for ULSI, Dipankar Pramanik et al., Solid State Technology Mar. 1990, No. 3, Westford, Mass. pp. 73–79.

Thin–film reactions of Al with Co, Cr, Mo, Ta, Ti, and W E. G. Golgan, et al., vol. 4, No. 1989 Materials Research Society, pp. 815–820.

Planarized Aluminum Deposition on TiW and TiN Layers by High Temperature Evaporation, G. E. Georgiou, et al., AT&T Bell Laboratories, Jun. 1989 VMIC Conference, pp. 315–321.

The properties of aluminum thin films sputter deposited at elevated temperatures, M. Inoue et al., J. Vac. Sci. Technol. May 6, 1988, pp. 1636–1939.

Evaluation of Titanium as a Diffusion Barrier Between Aluminum and Silicon for 1.2$\mu$m CMOS Integrated Circuits, M. Farahani, et al., Electrochemical Society Active Member, pp. 2835–2845, 1987.

Nonconformal Al Via Filling and Planarization by Partially Ionized Beam Deposition for Multilevel Interconnection, S. N. Mei, et al., 1987 IEEE, pp. 503–505.

Aluminum Alloy Planarization for Topography Control of Multi–level VLSI Interconnect, van Gogh, et al., 1987 IEEE, pp. 371–375.

Interconnect Materials for VLSI Circuits, Y. Pauleau, Centre National d'Etudes des Telecommunications, Meylan, France 1987, pp. 155–162.

Planarization of Al Alloy Film During High Rate Sputtering, V. Hoffman, et al., Mar. 1986, Report No. 122, pp. 1–20.

Sputtering and Interconnect Trends, Peter Burggraaf, Semiconductor International, Nov. 1984, pp. 70–73.

TiN formed by evaporation as a diffusion barrier between Al and Si, C. Y. Ting, IBM T. J. Watson Research Center, Yorktown Heights, New York 10598, May 6, 1982, pp. 14–18.

High–temperature contact structures for silicon semiconductor devices, M. Wittmer, Brown Boveri Research Center, 5406 Baden-Dattwil, Switzerland, Sep. 1980, pp. 540–542.

Silicon Processing for the VLSI Era, S. Wolf, et al., Lattice Press, Inc., 1986, pp. 332–374.

METHOD FOR FORMING AN ALUMINUM METAL CONTACT

This is a continuation of application Ser. No. 07/948,690, filed Sep. 22, 1992, now abandoned.

INCORPORATION BY REFERENCE

This application hereby expressly incorporates by reference U.S. Pat. No. 5,108,951 issued to Fusen E. Chen et al. titled METHOD FOR FOXING A METAL CONTACT.

BACKGROUND OF THE INVENTION

1. Field of the Invention

The present invention relates generally to semiconductor integrated circuits, and more specifically to a method for depositing metal layers in integrated circuits so as to form an improved interlevel contact.

2. Description of the Prior Art

In semiconductor integrated circuits, formation of metal interconnect layers is important to the proper operation of these devices. Metal interconnect signal lines make contact to lower conductive layers of the integrated circuit through vias in an insulating layer. For best operation of the device, the metal used to form the interconnect layer should completely fill the via.

Because of its physical properties, aluminum is especially suited for fabrication of metal interconnect lines in integrated circuits. However, the sputtering process used to apply aluminum thin film layers to an integrated circuit generally results in less than ideal filling of contact vias. Large aluminum grains tend to form on the upper surface of the insulating layer. Those grains which form at the edges of the contact via tend to block it before aluminum has a chance to completely fill the via. This results in voids and uneven structures within the via.

This problem is especially acute as integrated circuit devices are fabricated using smaller geometries. The smaller contacts used in these devices tend to have a larger aspect ratio (height to width ratio) than larger geometry devices, which exacerbates the aluminum filling problem.

The uneven thickness of the aluminum layer going into the via, caused by the step coverage problem just described, has an adverse impact on device functionality. If the voids in the via are large enough, contact resistance can be significantly higher than desired. In addition, the thinner regions of the aluminum layer will be subject to the well known electromigration problem. This can cause eventual open circuits at the contacts and failure of the device.

Many approaches have been used to try to ensure good metal contact to lower interconnect levels. For example, refractory metal layers have been used in conjunction with the aluminum interconnect layer to improve conduction through a via. Sloped via sidewalls have been used to improve metal filling in the via. The use of sloped sidewalls is becoming less common as device sizes shrink because the sloped sidewalls consume too much area on a chip.

Even with these techniques, the problems of completely filling a via with aluminum are not solved. In part this is because aluminum is deposited at a temperature which tends to encourage fairly large grain sizes. Voids and other irregularities within the contact continue to be problems with current technologies.

One technique which has been proposed to overcome the via filling problem is to deposit the aluminum interconnect layers at a temperature between 500° C. and 550° C. At these temperatures, the liquidity of the aluminum is increased, allowing it to flow down into the vias and fill them. This technique is described, for example, in *DEVELOPMENT OF A PLANARIZED Al-Si CONTACT FILLING TECHNOLOGY*, H. Ono et al, June 1990 VMIC Conference proceedings, pages 76–82. This references teaches that temperatures below 500° C. and above 550° C. result in degraded metal filling of contact vias. It is believed that use of such a technique still suffers from problems caused by large grain sizes.

Another technique for improving metal contact step coverage is described in U.S. Pat. No. 5,108,951 issued to Chen et al, entitled *METHOD FOR FORMING A METAL CONTACT*. This patent describes a technique for depositing aluminum at low deposition rates within a specified temperature range. The temperature is ramped up from a temperature below approximately 350° C. while aluminum is being deposited. The teachings of this patent provide for deposition of the majority of the depth of the aluminum layer at a temperature between approximately 400°–500° C. at relatively low deposition rates.

The teachings of the Chen patent provide improved step coverage deposition for aluminum contacts. However, the described technique still suffers from random voiding, which is believed to be caused by relatively large grain sizes, or initial film nucleation which are deposited at the temperatures described.

It would be desirable to provide a technique for depositing aluminum thin film layers on an integrated circuit so as to improve coverage in contact vias. It is further desirable that such a technique be compatible with current standard process flows.

SUMMARY OF THE INVENTION

Therefore, according to the present invention, a method is provided for depositing aluminum thin film layers so as to form an improved metal contact in a semiconductor integrated circuit device. An initial layer of aluminum is deposited at a very low temperature, such as room temperature, to a depth sufficient to form a continuous layer. A second aluminum layer is then deposited at increasing temperatures and lower deposition rates in order to complete the deposition of the layer.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
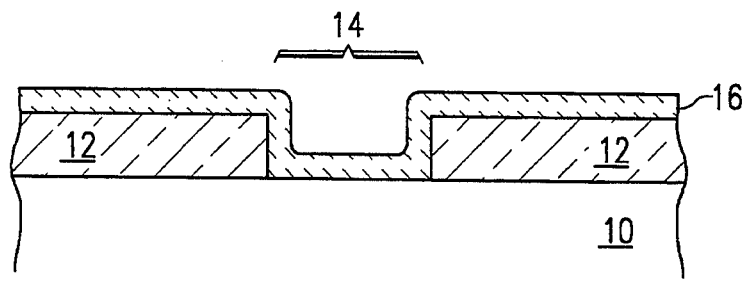
FIGS. 1–3 illustrate the formation of an aluminum contact according to the present invention.

Referring to FIG. 1, an integrated circuit device is formed on a semiconductor substrate 10. Although a substrate 10 is described, it will be apparent to those skilled in the art that the described technique may be used with a contact formed to any underlying conductive layer. Thus, the substrate 10 may include multiple layers of polycrystalline silicon and/or metallic interconnect, as well as being an active region in a monocrystalline silicon substrate.

An insulating layer 12 is formed over the substrate 10, and an opening 14 formed therethrough as known in the art. A barrier layer 16 of titanium nitride is conformally deposited over the insulating layer 12 and in the opening 14. Barrier layer 16 is preferably deposited to a depth of approximately 200-500 angstroms.

Figure 2:
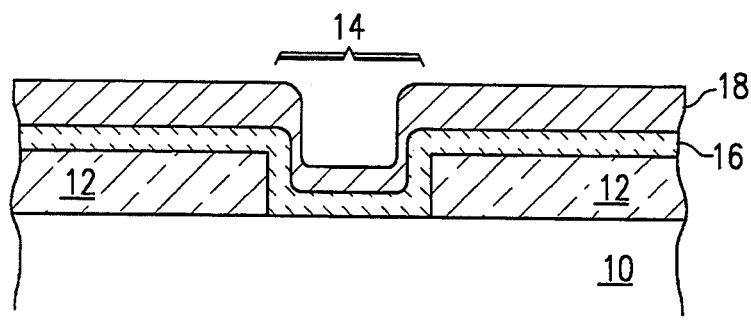

Referring to FIG. 2, an aluminum layer 18 is formed over the barrier layer 16. Aluminum layer 18 is preferably formed using known sputtering processes and by keeping the depth and temperature of deposition within certain limits. Preferably, aluminum layer 18 is deposited at a temperature which is as low as possible. For purposes of the described method, it is preferable to deposit aluminum layer 18 at temperatures less than 100° C. Some positive results, however, are achieved if aluminum layer 18 is deposited at 100° C. Room temperature (approximately 30° C.) produces good results.

The purpose of depositing aluminum layer 18 at such a low temperature is to provide an aluminum layer having extremely small grain size. Subsequently deposited aluminum layers will nucleate around the grains formed in layer 18. By minimizing the grain size of aluminum layer 18, the random voiding effect seen in higher temperature, prior art techniques is reduced or eliminated.

The aluminum layer 18 is an initial layer, and does not form the entire thickness of the interconnect layer. The depth to which layer 18 must be deposited will depend on the dimensions of the opening 14. Typical thicknesses of layer 18 will be 500-1000 angstroms when opening 14 has a width of between 0.5 and 1 micron. Layer 18 is preferably deposited to a depth which insures that a complete layer 18 is deposited. Therefore, layer 18 is typically a nominal thickness of no less than 200-300 angstroms.

The rate at which aluminum layer 18 is deposited is important. In general, the faster the rate of deposition of aluminum layer 18, the better the structure of the resulting layer. Therefore, rates of at least 100 angstroms per second are preferred with rates over 100 angstroms per second producing very good results. However, the technique may be practiced with rates of approximately 50 angstroms per second and below.

Figure 3:
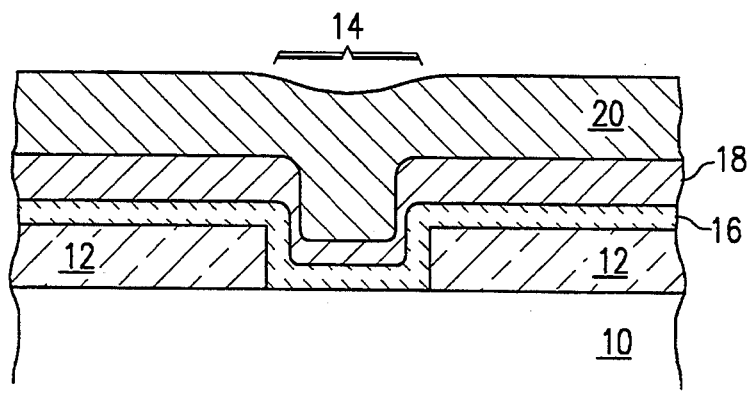

Referring to FIG. 3, a second aluminum layer 20 is formed over the first aluminum layer 18. This layer is formed at lower deposition rates and using techniques which allow the deposited aluminum to completely fill the opening 14. In the preferred embodiment, the techniques described in detail in U.S. Pat. No. 5,108,951, titled *METHOD FOR FORMING A METAL CONTACT*, issued to Fusen E. Chen et al. are used to form the second aluminum layer 20. U.S. Pat. No. 5,108,951 is expressly incorporated by reference. Such techniques provide for a very good inherent step coverage. The contact opening 14 is essentially filled by the aluminum layer 20, giving an approximately planar upper surface.

Deposition of the two layers works together to provide improved contacts. Relatively fast deposition of the first aluminum layer 18 at a low temperature provides for a very small grain size on first aluminum layer 18. Deposition of aluminum layer 18 under these conditions provides poor step coverage. Overall step coverage is improved by deposition of a second aluminum layer 20 under the conditions described in the referenced patent.

The technique described in the Chen reference provides very good step coverage, but results in larger aluminum grains than is desired. However, when layer 20 is formed over layer 18 under the conditions described above, nucleation of the aluminum in layer 20 onto the extremely small grains formed in layer 18 minimizes the growth of large grains, and can reduce or eliminate the random voiding problem caused by occasional large grain growth.

Since the deposition process for forming layer 20 is performed primarily between 400°-500° C., the chamber in which layer 20 is deposited is relatively warm. A fairly long time is required to cool a single chamber from nearly 500° C. back down to room temperature. Such delays negatively impact the throughput of a factory. Therefore, the present method is preferably practiced in conjunction with a multichamber sputtering machine, in which first layer 18 is deposited in a first chamber at room temperature, after which the wafer is moved to a second chamber for deposition of layer 20. Heated argon gas, typically used to raise the temperature of the wafer during deposition, is not used in the first chamber. However, heated argon gas may be used in the second chamber to raise the temperature of the wafer for deposition of layer 20. In this manner, the chamber used to deposit layer 18 is never heated, and throughput does not suffer. In general, layer 18 will be deposited in much less time than layer 20. It may be desirable to have several heated chambers allocated for each room temperature chamber used for sputtering of aluminum.

Figure 4:
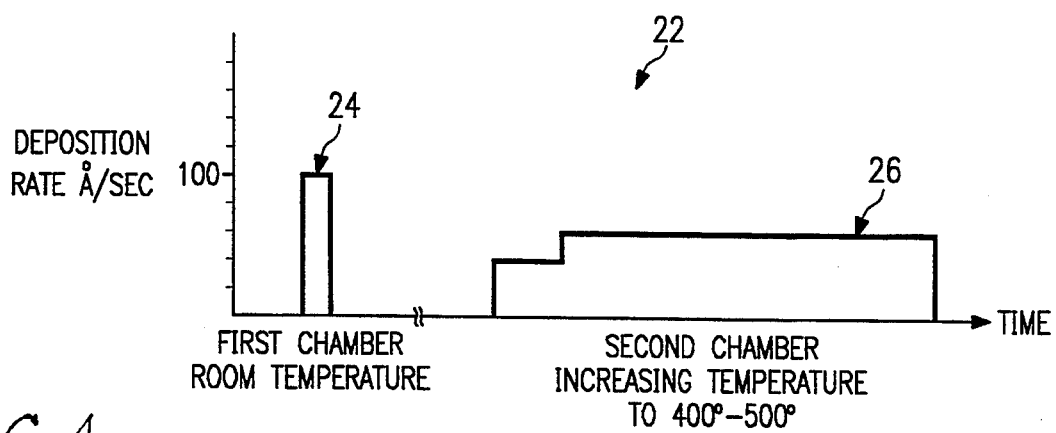
FIG. 4 is a graph illustrating preferred process conditions for formation of an aluminum contact.

FIG. 4 is a graph 22 illustrating deposition rates of aluminum layers 18, 20 according to one embodiment of the invention. In a first chamber, preferably maintained at a low temperature such as room temperature, curve 24 illustrates that a relatively high deposition rate is used for a short period of time to form layer 18. The wafer containing the integrated circuit device is then moved into the second chamber, and layer 20 is deposited according to curve 26 at a lower rate and increasing temperature. Preferably, the temperature and rate of deposition in the second chamber embodies the teachings of the Chen patent incorporated by reference above. Curve 26 indicates deposition at a rate of 40 angstroms per second for a short period of time, followed by deposition at 60 angstroms per second. Other deposition rates and times, such as those described in connection with FIG. 4 of the Chen patent, may be used with equally good results.

Variations on the deposition rates and times may be used to practice the invention as will be apparent to those skilled in the art. As described above, the thickness of the first aluminum layer 18 will depend upon the size of the opening 14. The smaller the dimensions of opening 14, the thinner layer 18 must be in order not to completely block the contact opening prior to deposition of layer 20.

A barrier layer 16 as described in FIG. 1 is optional. The barrier layer seems to improve the grain sizes of the deposited aluminum layer 18 somewhat. However, even without deposition of barrier layer 16, layer 18 is formed with relatively small grain sizes. In practice, the presence of a barrier layer 16 formed of titanium nitride or other material will generally depend upon the nature of the substrate 10 underlying the opening 14. The titanium nitride can be used as a barrier material to prevent aluminum spiking into the substrate 10. If the upper surface of substrate 10 is a polycrystalline silicon interconnect line, or metallic interconnect, the barrier layer 16 may not be necessary.

While the invention has been particularly shown and described with reference to a preferred embodiment, it will be understood by those skilled in the art that various changes in form and detail may be made therein without departing from the spirit and scope of the invention.

What is claimed is:

1. A method for forming an integrated circuit contact structure, comprising the steps of:

forming an insulating layer on a semiconductor device:

forming an opening through the insulating layer to the semiconductor device;

depositing a first aluminum layer over the insulating layer and extending into the opening, wherein the first aluminum layer is deposited at a temperature less than approximately 100° C. at a rate greater than approximately 100 Å/sec, to a thickness less than approximately 1000 Å stopping aluminum deposition, then beginning to heat the integrated circuit; and depositing a second aluminum layer over the first aluminum layer while the temperature of the integrated circuit is increasing, wherein the second aluminum layer is deposited at a temperature of between approximately 400° C. and 500° C. at a deposition rate which is low enough to allow surface migration of the deposited second aluminum layer to fill low regions in the integrated circuit.

2. The method according to claim 1 further comprising the step of forming a barrier layer over the insulating layer and extending into the opening before the step of forming the first aluminum layer.

3. The method according to claim 2 wherein the barrier layer is comprised of titanium nitride.

4. The method according to claim 1, wherein the first aluminum layer is deposited at approximately room temperature.

5. The method according to claim 1, wherein the first aluminum layer is deposited at less than room temperature.

6. The method according to claim 1 wherein the thickness of the first aluminum layer is approximately 200–300 angstroms.

7. The method according to claim 1 wherein the second aluminum layer is deposited at a rate of less than approximately 60 angstroms/second.

8. The method according to claim 1, further comprising the step of:

after stopping aluminum deposition and before beginning to heat the integrated circuit, moving a semiconductor wafer containing the integrated circuit from a first sputtering chamber used for depositing the first aluminum layer to a second sputtering chamber used for depositing the second aluminum wafer.

9. The method according to claim 8, wherein the first and second sputtering chambers form part of a multi-chamber sputtering machine.

* * * * *